(12) United States Patent
Han et al.

(10) Patent No.: US 12,726,155 B2
(45) Date of Patent: Sep. 1, 2026

(54) ACTIVE FREQUENCY MIXER AND FREQUENCY MIXING METHOD WITH IMPROVED GAIN AND NOISE

(71) Applicant: THE INDUSTRY & ACADEMIC COOPERATION IN CHUNGNAM NATIONAL UNIVERSITY (IAC), Daejeon (KR)

(72) Inventors: Junghwan Han, Daejeon (KR); Junhyeop Kim, Daejeon (KR)

(73) Assignee: THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 0 days.

(21) Appl. No.: 19/080,959

(22) Filed: Mar. 17, 2025

(65) Prior Publication Data

US 2026/0121581 A1 Apr. 30, 2026

(30) Foreign Application Priority Data

Oct. 30, 2024 (KR) ........................ 10-2024-0151542

(51) Int. Cl.
*H03D 7/14* (2006.01)

(52) U.S. Cl.
CPC ......... *H03D 7/1441* (2013.01); *H03D 7/1458* (2013.01)

(58) Field of Classification Search
CPC ........................... H03D 7/1441; H03D 7/1458
USPC ........................................ 327/355, 356, 359
See application file for complete search history.

(56) References Cited

U.S. PATENT DOCUMENTS

2007/0126491 A1* 6/2007 Woo ..................... H03D 7/1441 327/359
2024/0275425 A1* 8/2024 Elsayed ................. H04B 1/525

* cited by examiner

*Primary Examiner* — William Hernandez
(74) *Attorney, Agent, or Firm* — S.J. INTELLECTUAL PROPERTY LTD.

(57) ABSTRACT

An active frequency mixer comprises magnetically coupled inductors, including a transconductance stage configured to receive an RF signal and output a current corresponding to the input signal, a switching stage configured to convert a frequency of a signal output from the transconductance stage using a local oscillation signal and output the converted frequency signal, a load stage electrically connected between the switching stage and a power terminal, and a current bleeding stage connected in parallel with the load stage and outputting a bleeding current to the switching stage.

11 Claims, 22 Drawing Sheets

[FIG. 1A]
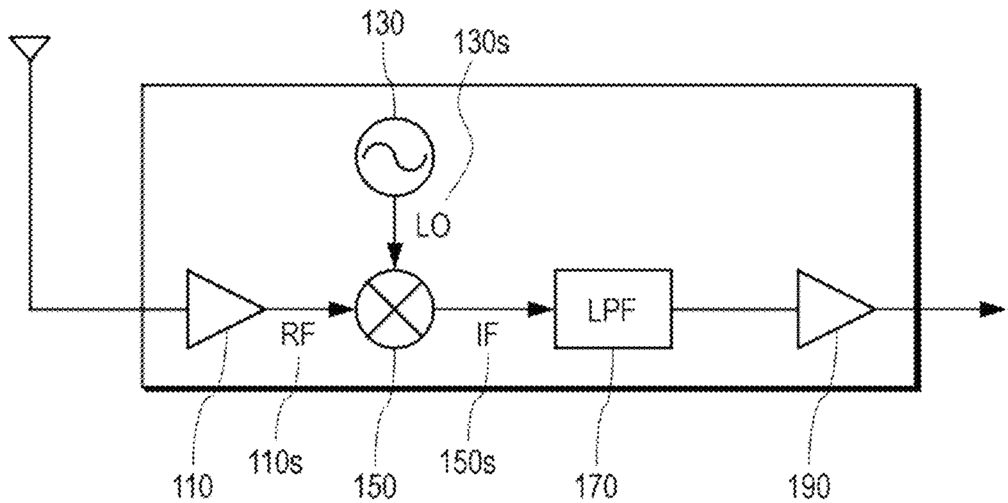

[FIG. 1B]
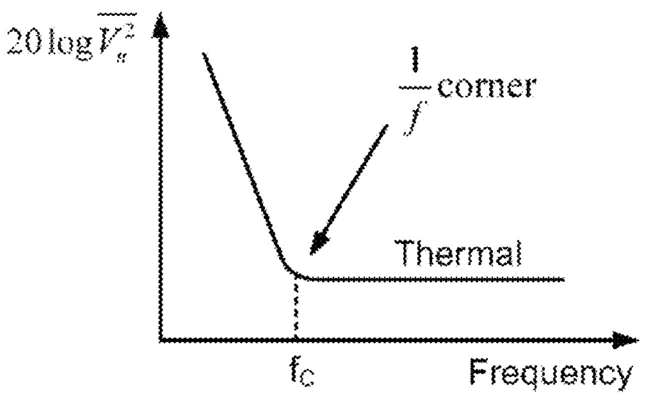

[FIG. 2A]
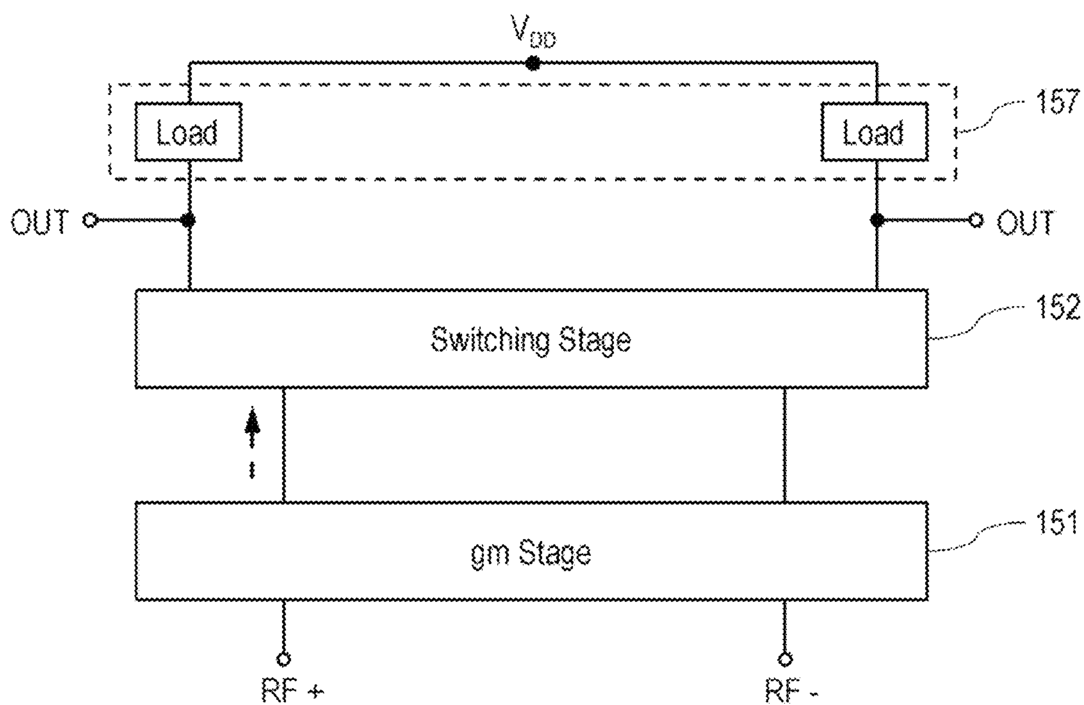

[FIG. 2B]
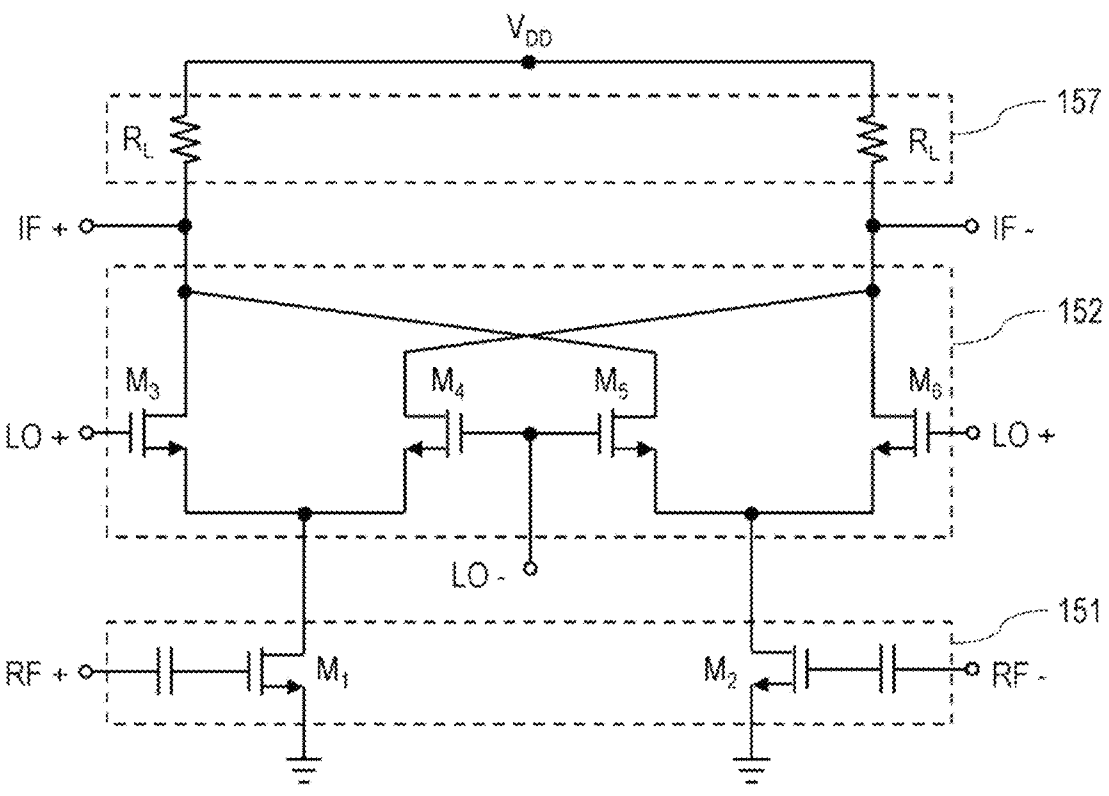

[FIG. 3A]
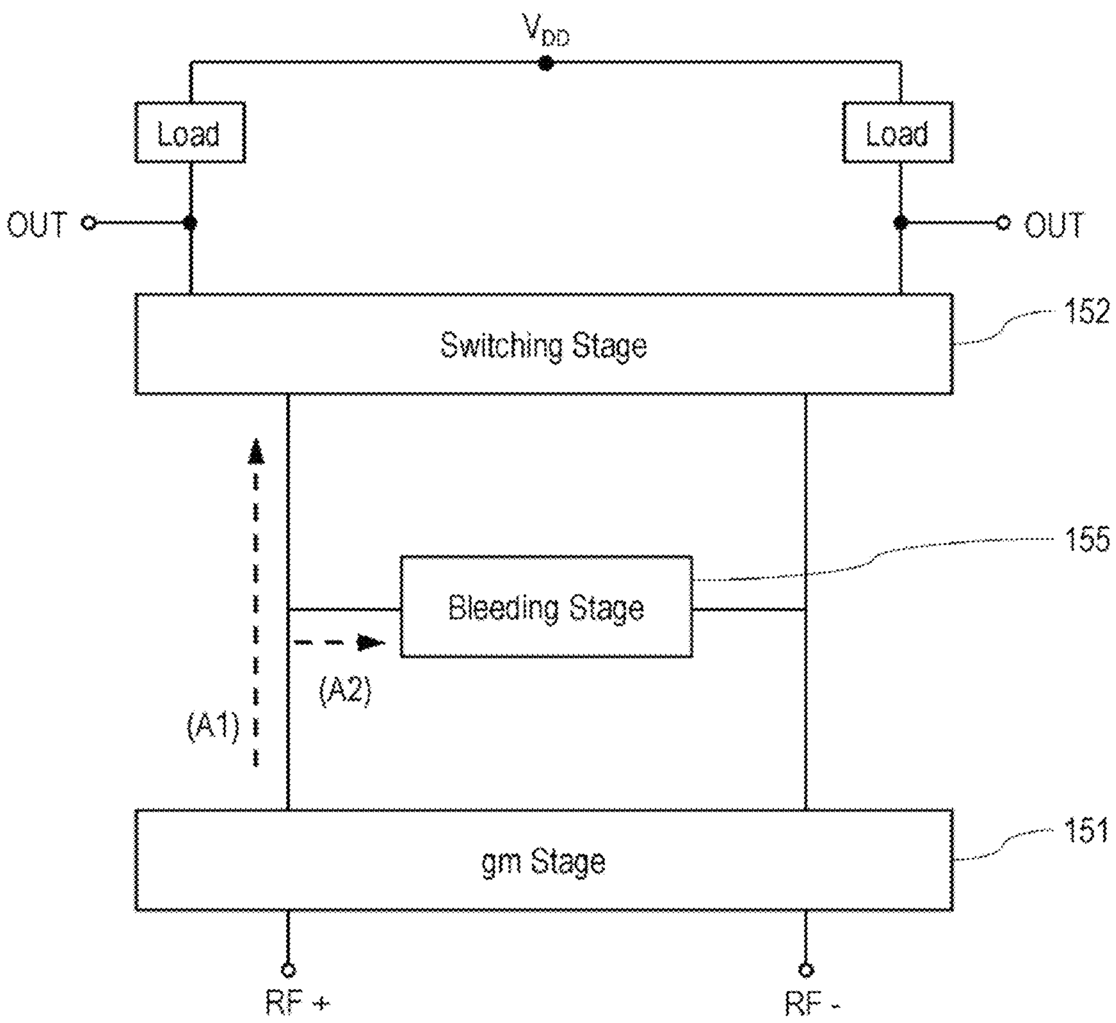

[FIG. 3B]
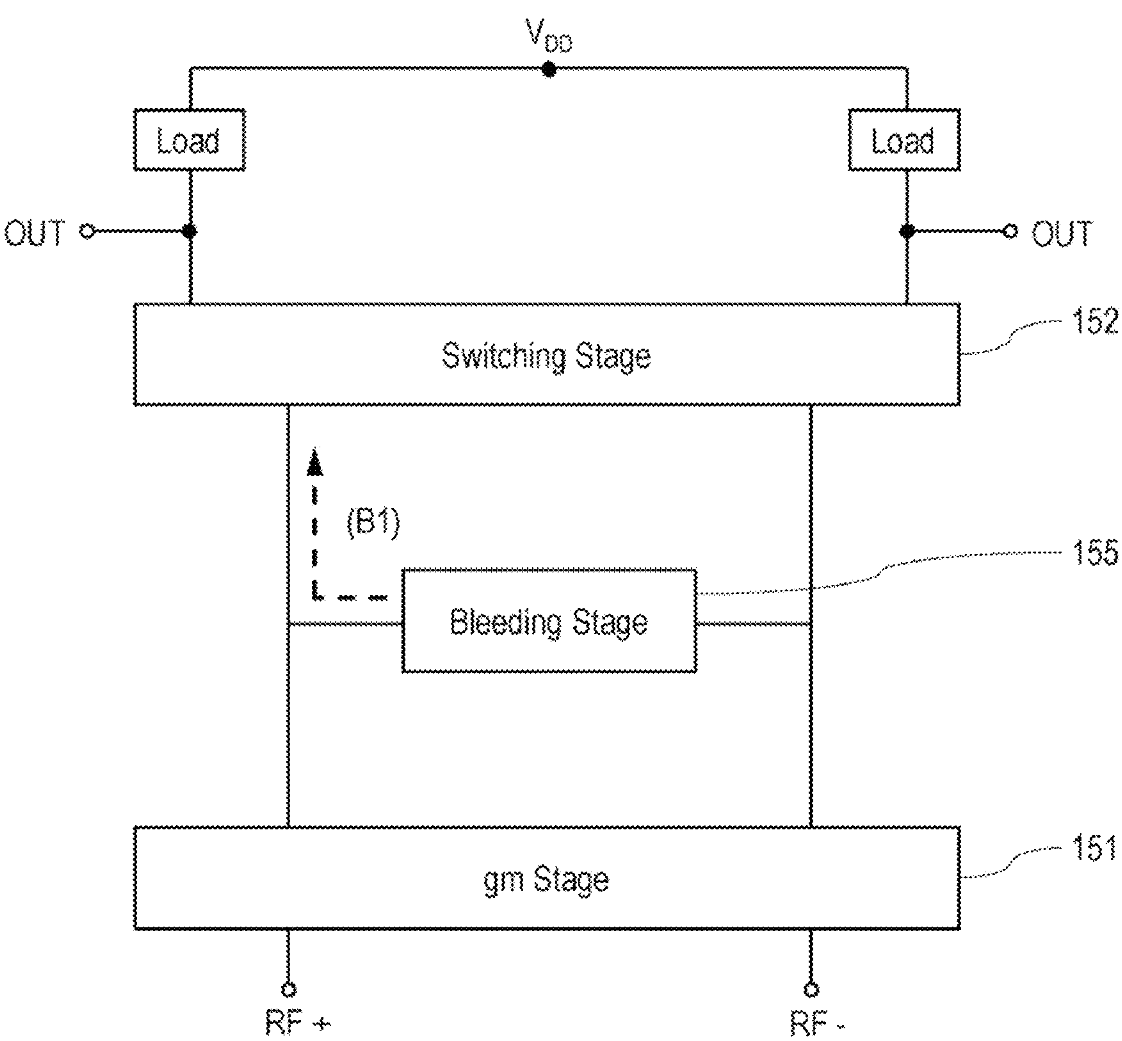

[FIG. 3C]
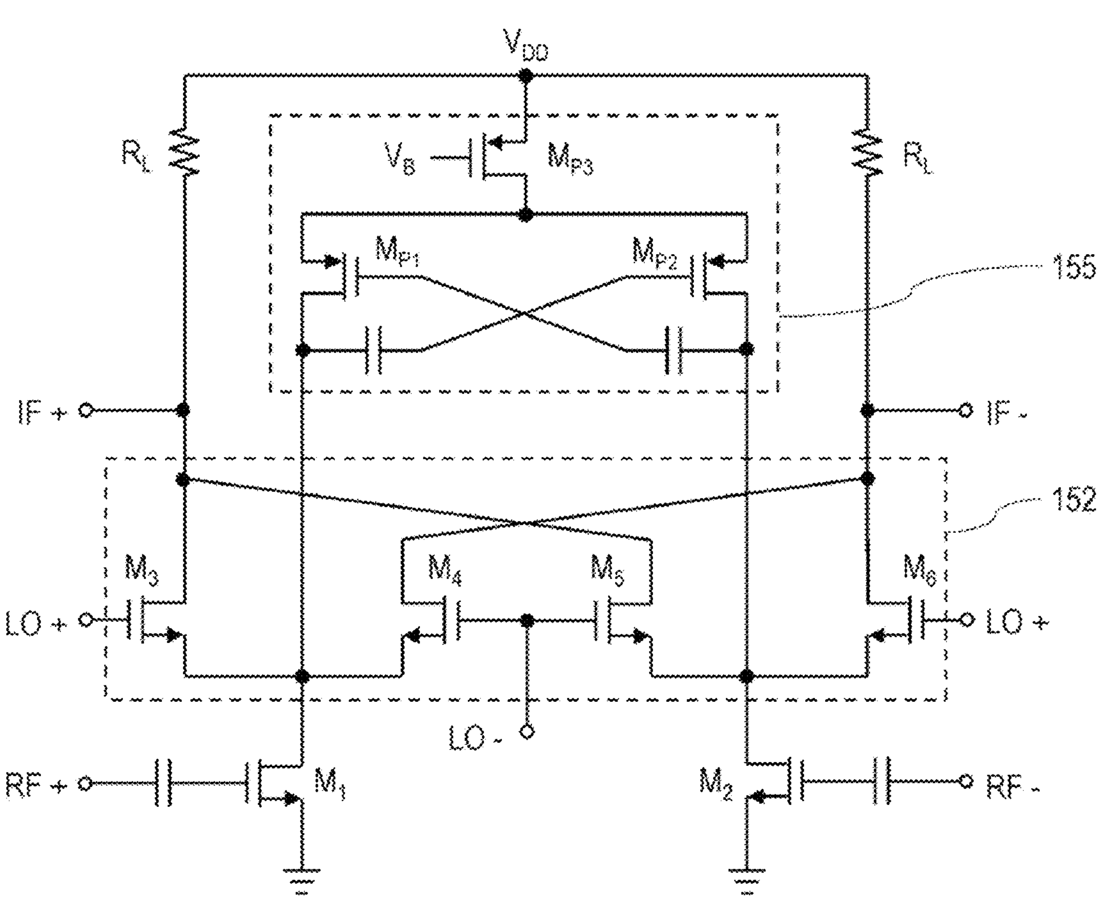

[FIG. 4A]
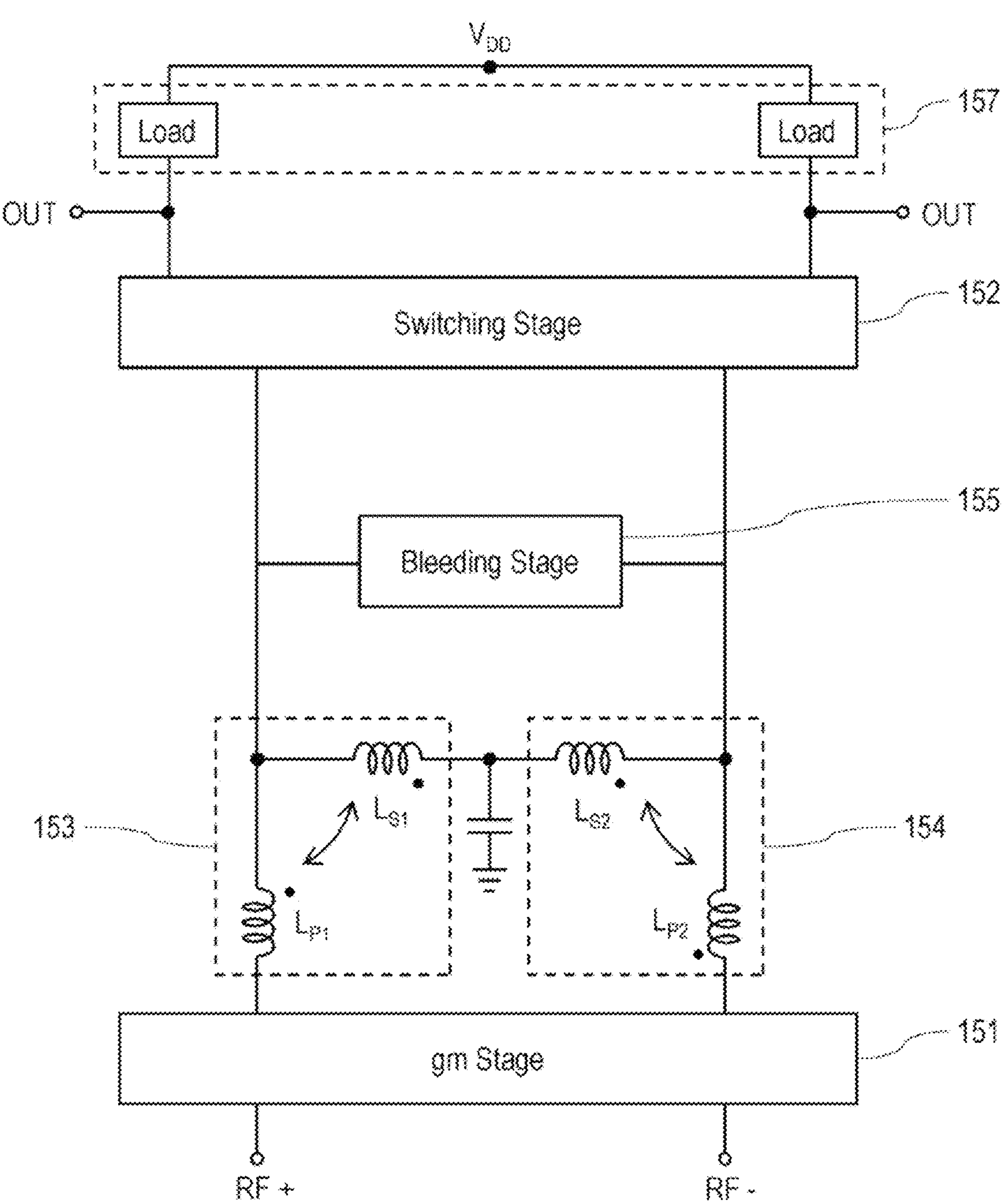

[FIG. 4B]
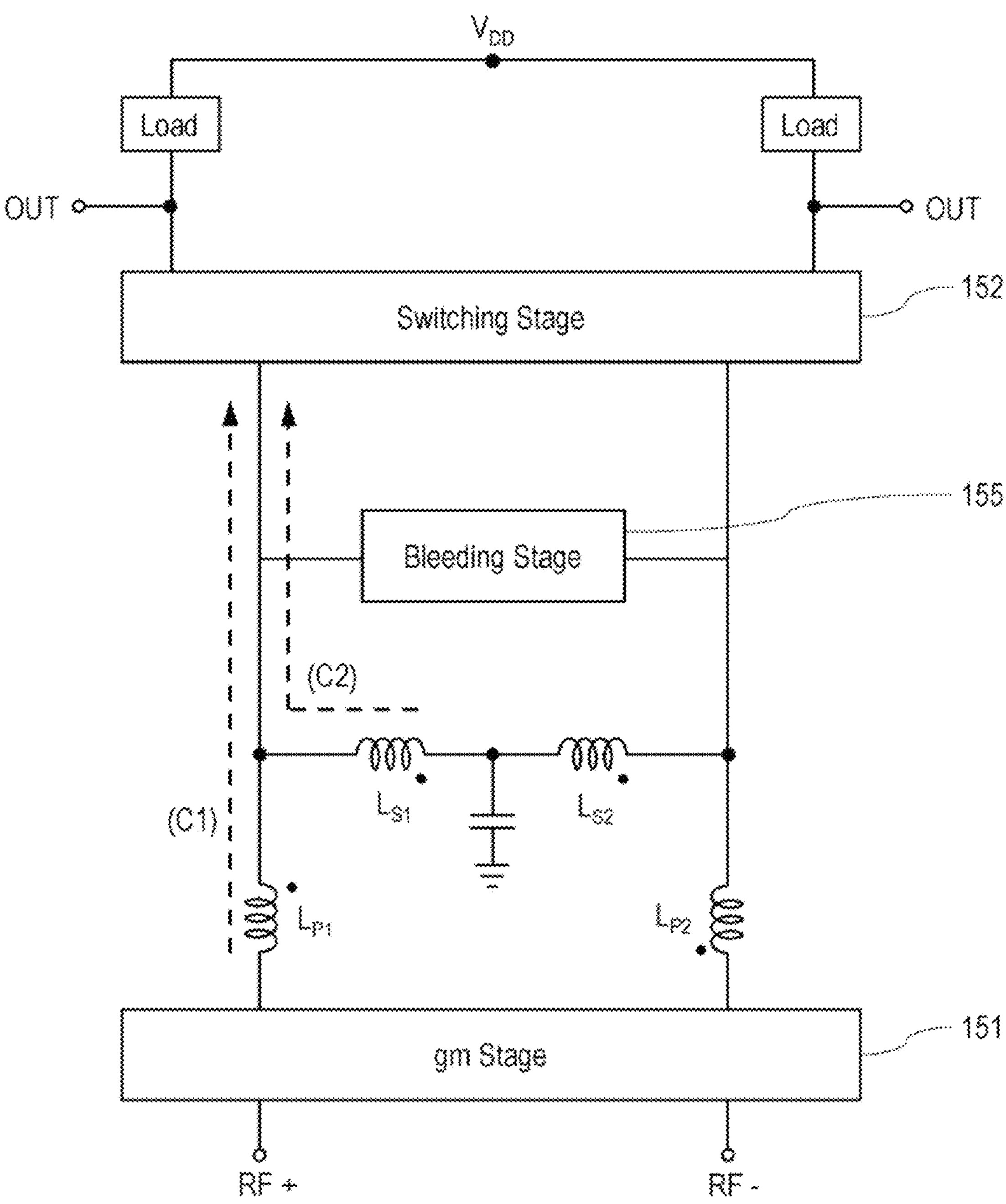

[FIG. 4C]
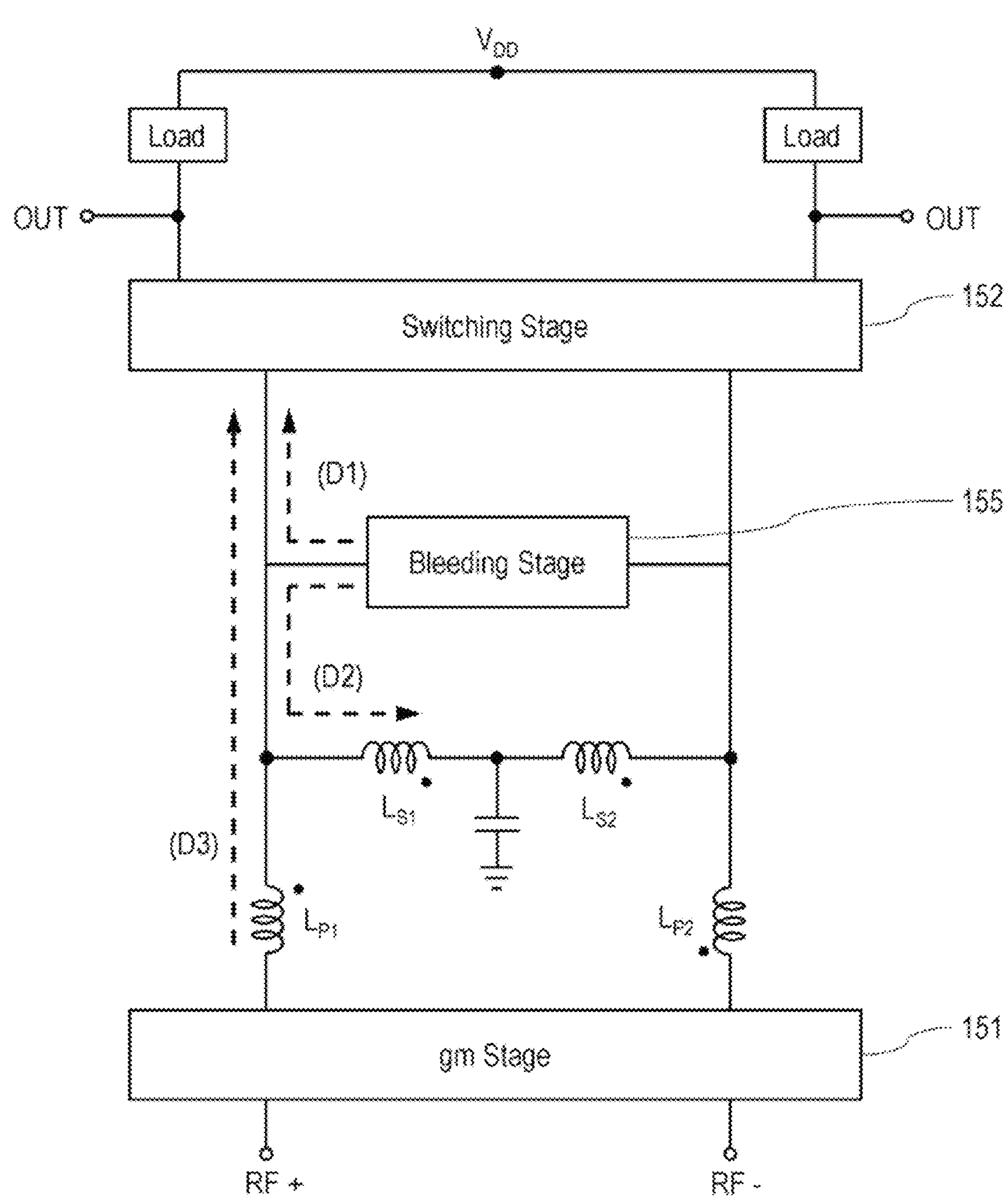

[FIG. 5]
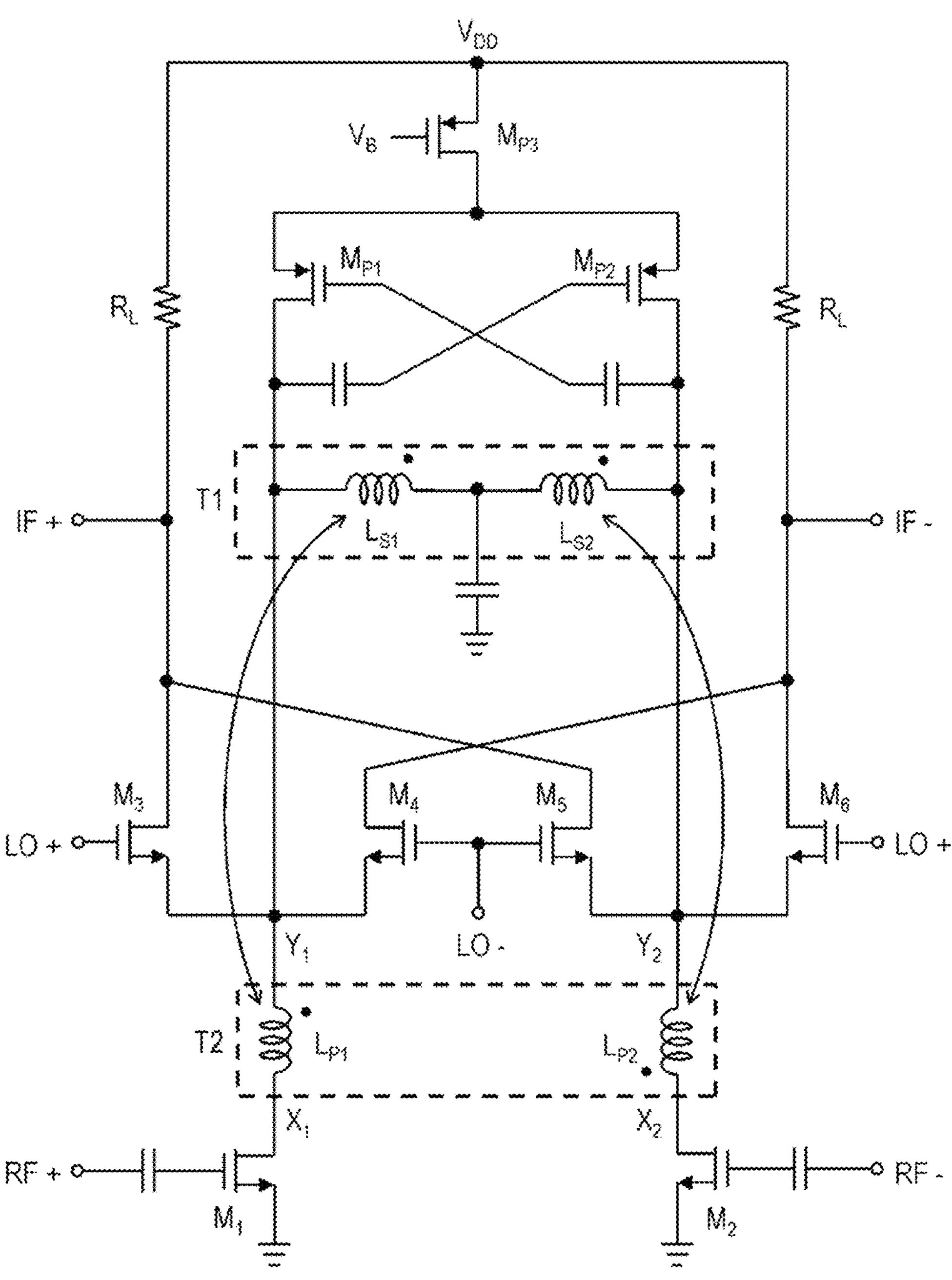

[FIG. 6]
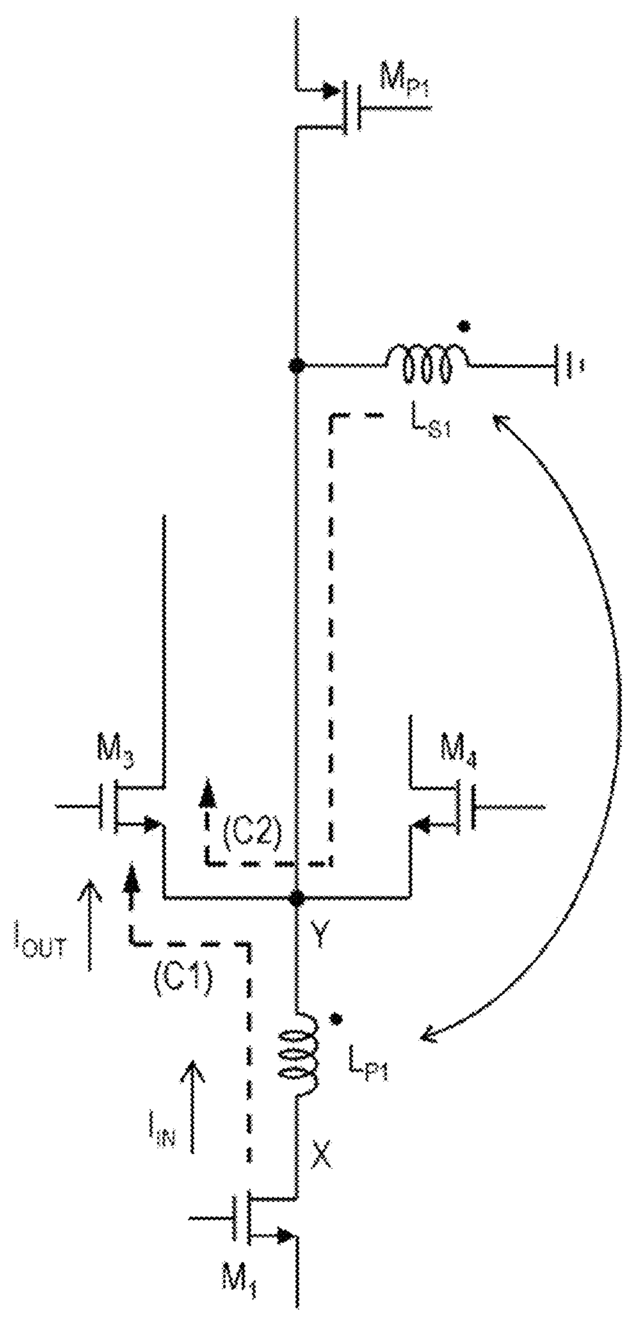

[FIG. 7]
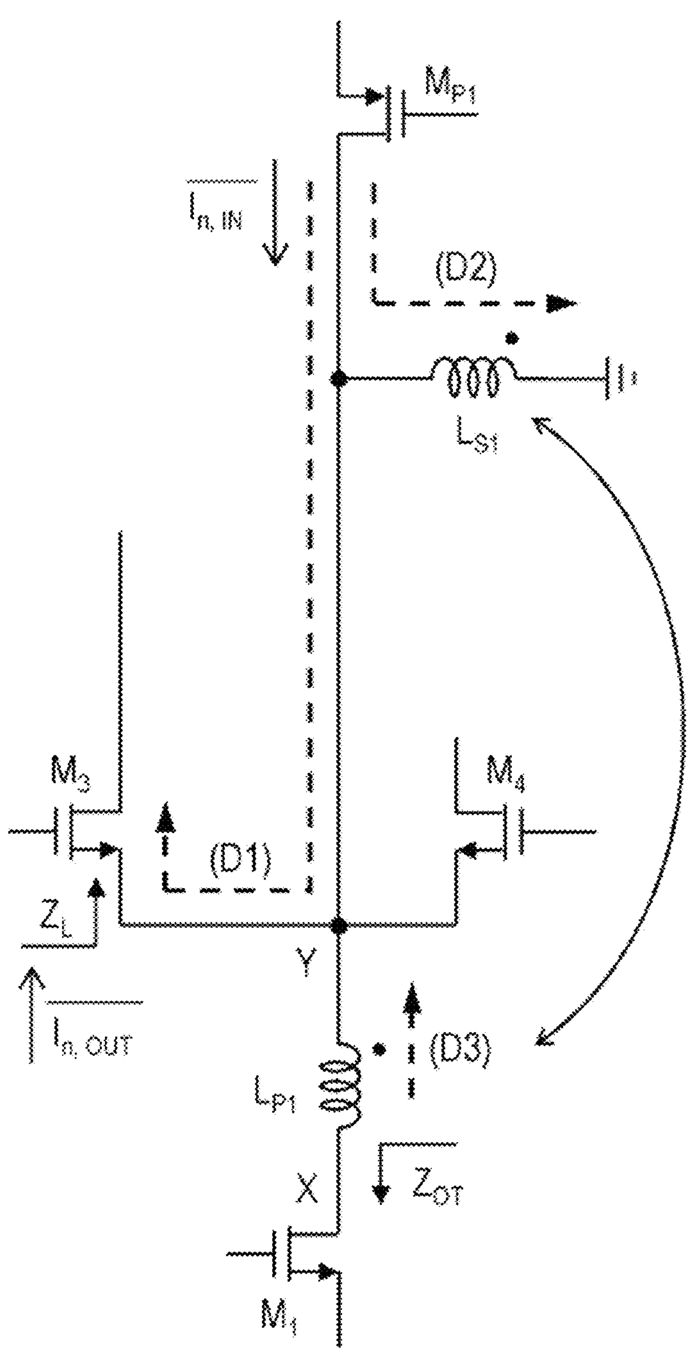

[FIG. 8A]
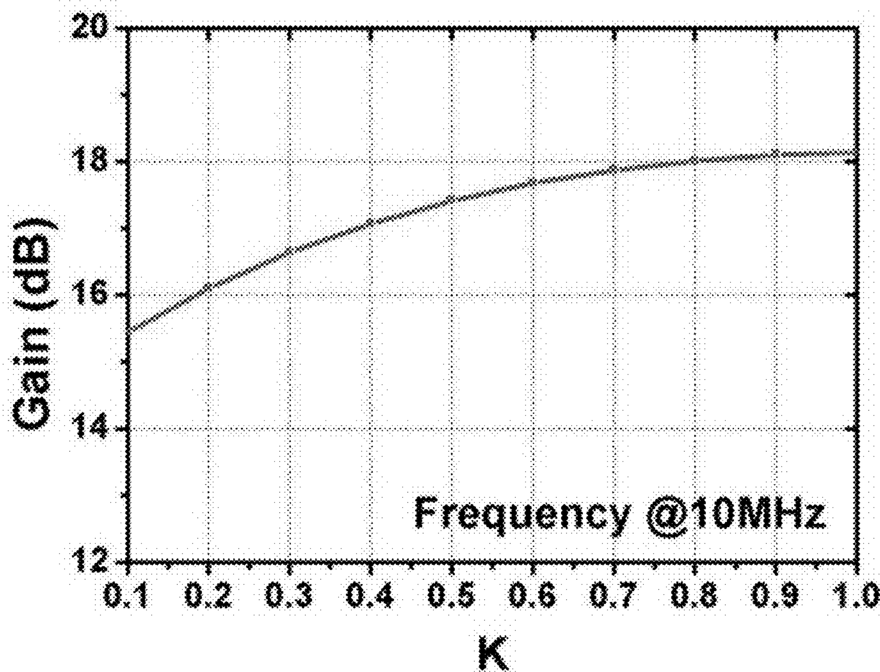

[FIG. 8B]
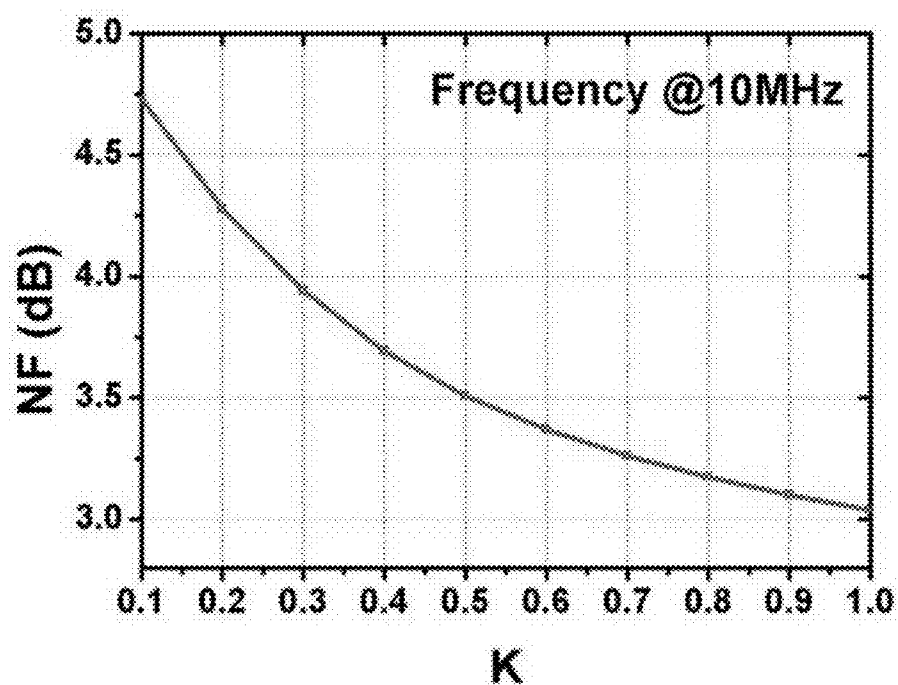

[FIG. 9A]
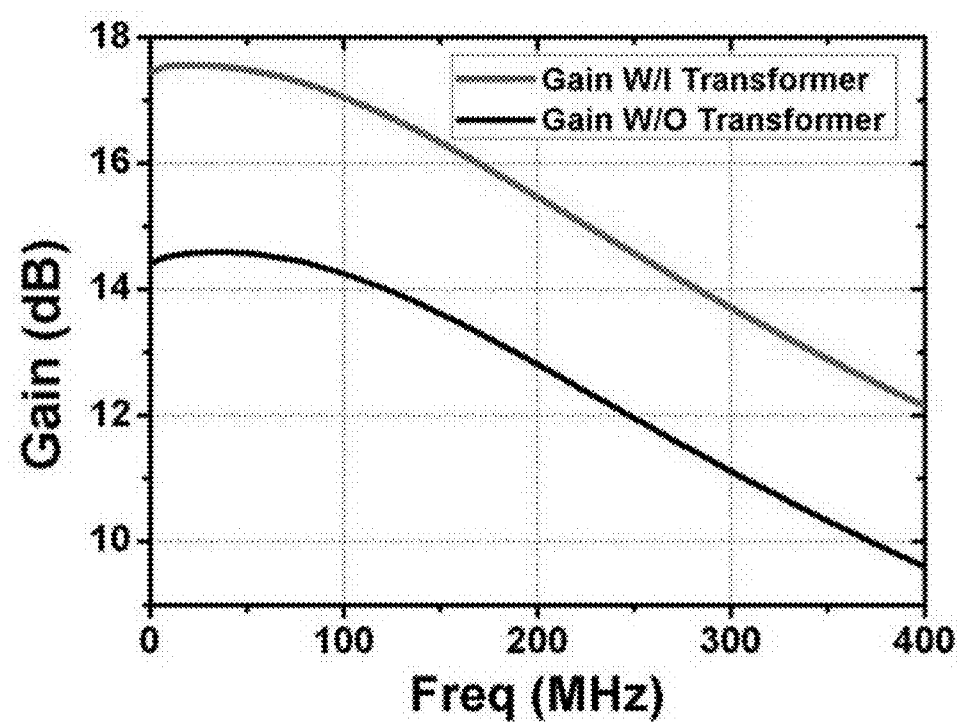

[FIG. 9B]
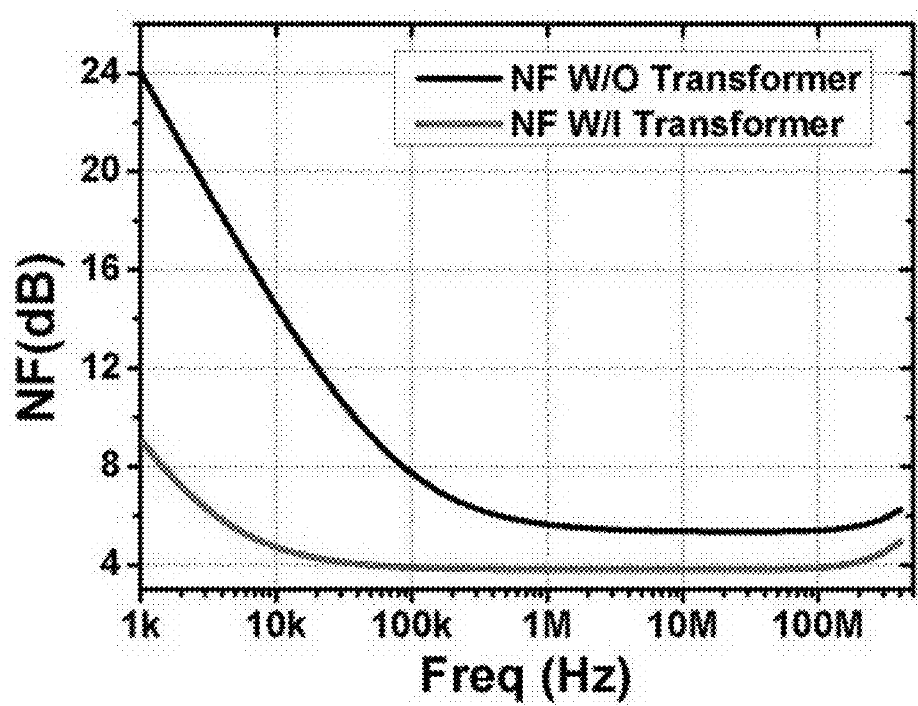

[FIG. 10]
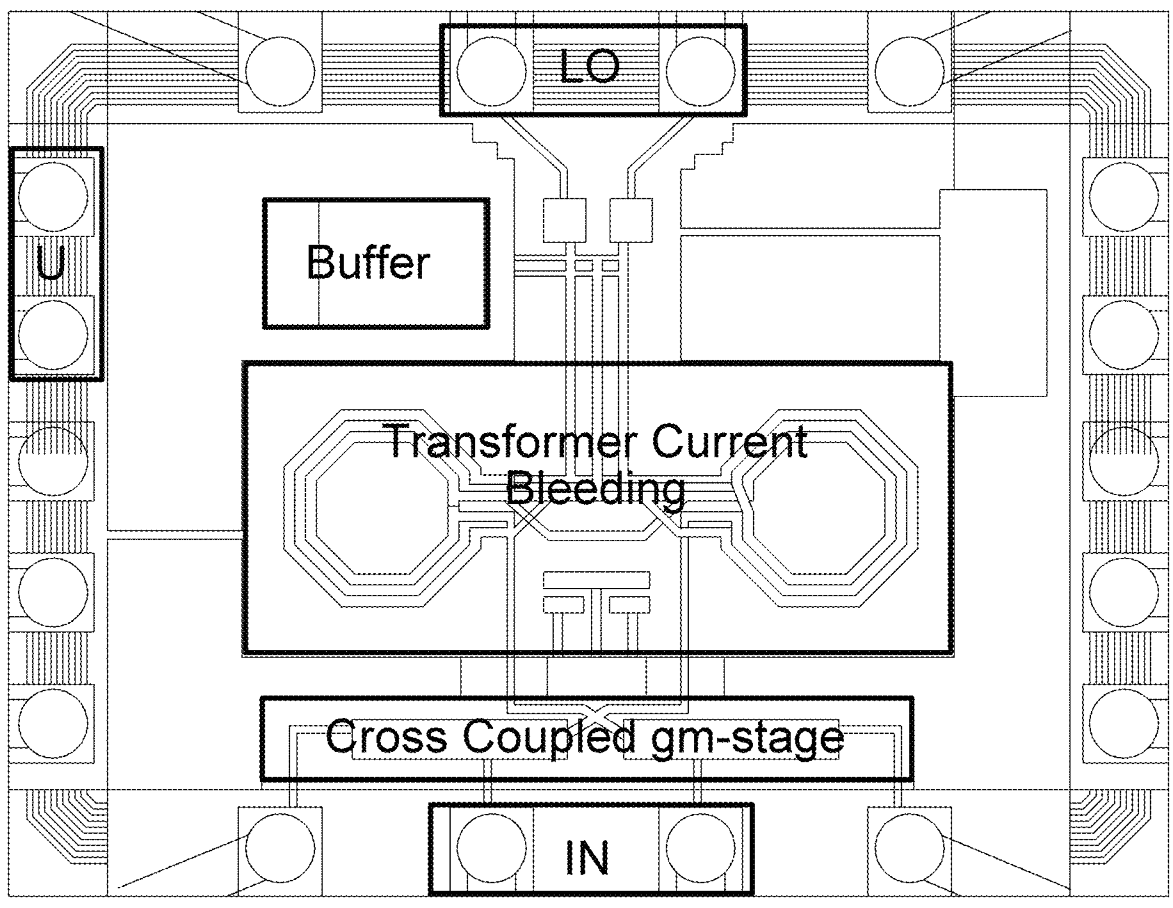

[FIG. 11]
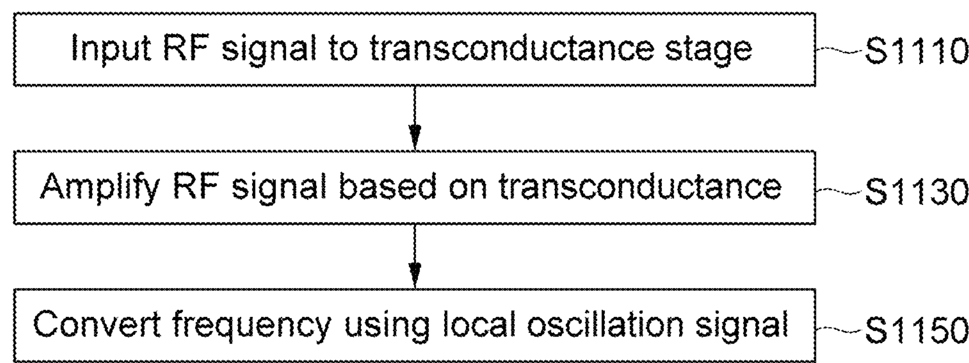

[FIG. 12]
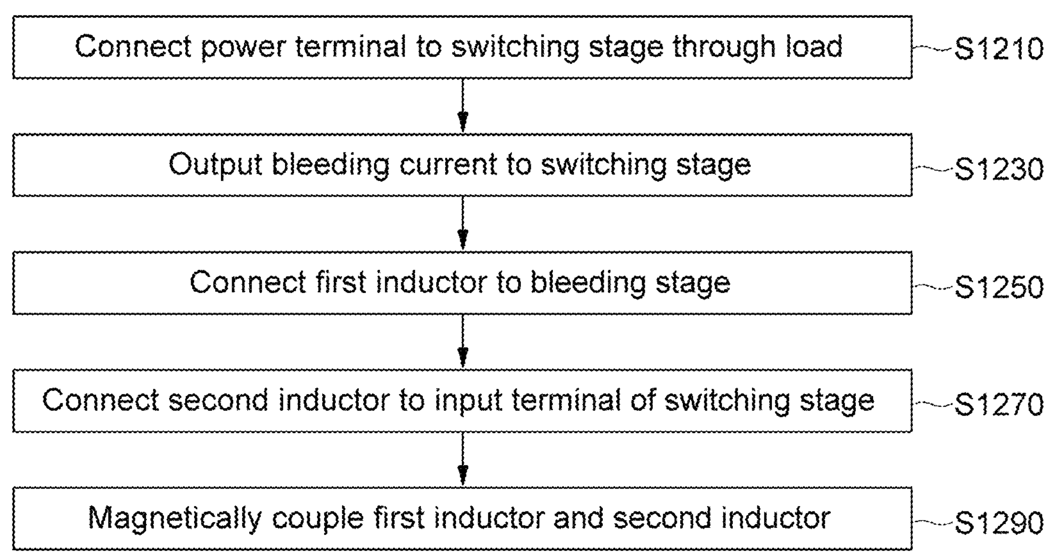

[FIG. 13]
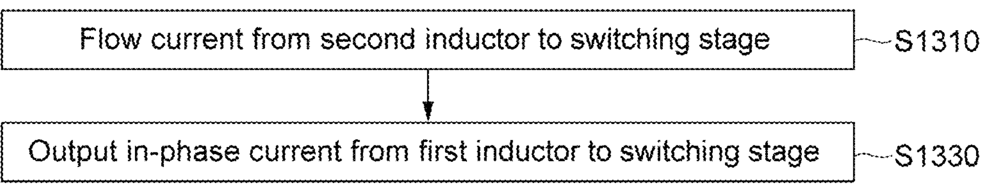

[FIG. 14]
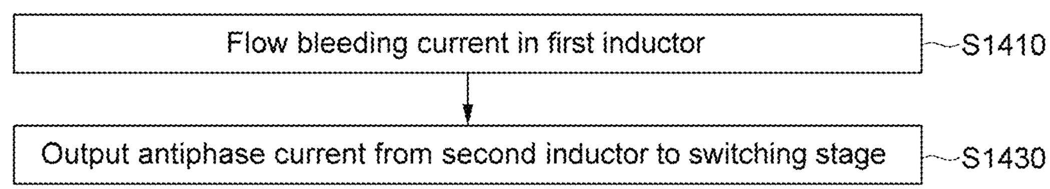

ACTIVE FREQUENCY MIXER AND FREQUENCY MIXING METHOD WITH IMPROVED GAIN AND NOISE

STATEMENT REGARDING GOVERNMENT SPONSORED RESEARCH OR DEVELOPMENT

This work was supported in part by the Next Generation Intelligence Semiconductor Foundation Program (20025736, Development of MICS SoC and platform for in-vivo implantable electroceutical device) funded by the Ministry of Trade, Industry & Energy (MOTIE, Korea) under Grant 20025736 and in part by Basic Science Research Program through the National Research Foundation of Korea (NRF) funded by the Ministry of Education (MOE) under Grant RS-2023-00246633.

CROSS-REFERENCE TO RELATED APPLICATION

This application claims the benefit of and priority to Korean Patent Application No. 10-2024-0151542, filed on Oct. 30, 2024, the entire disclosure(s) of which is hereby incorporated herein by reference in its entirety.

TECHNICAL FIELD

The present disclosure generally relates to a frequency mixer that converts the frequency of an RF signal into a local oscillation signal, and more particularly, to an active frequency mixer capable of improving gain and noise using coupled inductors or a transformer.

BACKGROUND

As reception systems for various frequency bands such as 5/6G mobile communications and Medical Implant Communication System (MICS) are developed, support for a wide frequency band is constantly required. In addition, fields requiring ultra-low power consumption such as quantum computing and IOT are gradually increasing.

A direct conversion receiver (DCR) is a structure suitable for improving low-cost and low-power characteristics. However, when the DCR is designed based on CMOS, it has poor noise characteristics and has the disadvantage of low conversion gain performance, and thus a low-noise and high-gain design is required.

The Gilbert cell-based direct conversion active mixer, which is generally used in the direct conversion receiver (DCR) has an advantage of obtaining high gain, but there is a problem that low-frequency noise, flicker noise, appears in the output. Therefore, in the case of the direct conversion frequency mixer, it is essential to reduce this flicker noise having low-frequency characteristics.

In order to compensate for the flicker noise in the direct conversion frequency mixer, a method of applying a static current bleeding circuit or a dynamic current bleeding circuit to the Gilbert cell-based active frequency mixer structure is being used.

The method of applying the static current bleeding circuit improves the flicker noise by reducing the DC current of a switching device of the frequency mixer while maintaining the gain of the transconductance stage using the added static current bleeding circuit.

However, in the case of the static current bleeding circuit, the input resistance of the switching device increases by continuously reducing the current throughout the entire signal cycle. This causes more radio frequency (RF) signals to leak into a parasitic capacitance path, which reduces the conversion gain of the frequency mixer. In addition, there is a disadvantage in that the additional parasitic capacitance $C_P$ caused by the added static current bleeding circuit increases, further reducing the mixer conversion gain.

The method of applying the dynamic current bleeding circuit applies a dynamic current bleeding structure that bleeds the current only in the switching section of the mixer where flicker noise mainly occurs. Therefore, compared to the static current bleeding structure, RF signal leakage is reduced by keeping the input resistance of the switching device in the on state low, thereby improving the conversion gain and noise performance of the entire mixer.

However, there is still a problem that an influence of the parasitic capacitance $C_P$ caused by the added dynamic current bleeding circuit is present.

Meanwhile, a structure with an added inductor can be used to eliminate the influence of the parasitic capacitance $C_P$ due to static/dynamic current bleeding circuits. In this case, by resonating the parasitic capacitance $C_P$ and the inductor at the operating frequency, the influence of the parasitic capacitance $C_P$ can be reduced.

However, in the case of a direct conversion frequency mixer structure, although the influence of flicker noise and parasitic capacitor can be improved, the conversion gain is still reduced and thermal noise increases compared to the Gilbert cell active mixer that does not use a current bleeding circuit due to the additional noise of the device of the added bleeding circuit and signal leakage.

Patent No. KR 10-1390037 B1, published on Apr. 29, 2014, relates to a "frequency mixer". In order to realize high gain, low noise and low power, a frequency mixer including an input part for receiving RF signals and a current bleeding part connected to the input part is disclosed. In particular, the current bleeding part has a configuration including at least one inductor that prevents RF signals from being mixed and canceled.

SUMMARY

An object of the present disclosure is to provide a novel direct conversion active frequency mixer that improves noise and conversion gain performance compared to the conventional frequency mixers without increasing the size and power consumption.

Another object of the present disclosure is to provide a frequency mixer that improves signal-to-noise ratio performance by reducing the influence of a current bleeding circuit and parasitic capacitance for reducing flicker noise.

Another object of the present disclosure is to provide a direct conversion receiver that improves gain and noise performance by using an improved frequency mixer.

The objects to be achieved by the present disclosure are not limited to the objects mentioned above, and other objects that are not mentioned can be clearly understood by those skilled in the art from the description below.

According to some embodiment of the present disclosure, an active frequency mixer having magnetically coupled inductors may comprise a transconductance stage, a switching stage, a load stage, a current bleeding stage, a first inductor stage, and a second inductor stage.

The transconductance stage may receive an RF signal and outputs a current corresponding to the input signal. The switching stage may convert a frequency of a signal output from the transconductance stage using a local oscillation signal and outputs the converted frequency signal. The load stage may be electrically connected between the switching stage and a power terminal. The current bleeding stage may be connected in parallel with the load stage and outputs a bleeding current to the switching stage. The first inductor stage may comprise a first inductor having one end electrically connected to an output terminal of the current bleeding stage. The second inductor stage may comprise a second inductor electrically connected between an output terminal of the transconductance stage and an input terminal of the switching stage. The first inductor and the second inductor may be magnetically coupled to each other.

According to an additional embodiment, the first inductor and the second inductor may be configured as a transformer.

According to an additional embodiment, the first inductor and the second inductor may be configured as a transformer in which coils are disposed inside or outside each other, or stacked on top of each other.

According to an additional embodiment, the first inductor may induce a signal having the same phase as a current input to the switching stage from the second inductor and output the induced signal to the switching stage.

According to an additional embodiment, the second inductor may induce a signal having an opposite phase to the bleeding current flowing in the first inductor and output the signal to the switching stage.

According to an additional embodiment, the switching stage may be configured in the form of a Gilbert cell in which four transistors are dually balanced.

According to an additional embodiment, the transconductance stage may be configured as a differential pair to amplify a difference between two input signals.

According to another embodiment of the present disclosure, a communication device may comprise a low noise amplifier, a local oscillator, a frequency mixer, and a low pass filter.

The low noise amplifier may amplify an RF signal received by an antenna and outputs the amplified RF signal. The local oscillator may output an oscillation signal having a frequency different from a frequency of the RF signal. The frequency mixer may receive the output signal of the low noise amplifier and the oscillation signal of the local oscillator, may output a signal having a frequency converted from the RF signal, and may have the above-described features. The low pass filter may receive an output signal of the frequency mixer and may output a signal having a frequency lower than a predetermined threshold frequency.

According to another embodiment of the present disclosure, a frequency mixing method may comprise receiving an RF signal by a transconductance stage, amplifying the input signal based on a transconductance, and outputting the amplified current to a switching stage, converting a frequency of the signal amplified based on the transconductance using a local oscillation signal and outputting the converted frequency signal by the switching stage, electrically connecting a power terminal to the switching stage using a load, outputting a bleeding current from a current bleeding stage connected in parallel with the load to the switching stage, electrically connecting one end of a first inductor to an output terminal of the current bleeding stage, electrically connecting a second inductor between an output terminal of the transconductance stage and an input terminal of the switching stage, and magnetically coupling the first inductor and the second inductor to each other.

According to an additional embodiment, the frequency mixing method may further comprise, if a current is input from the second inductor to the switching stage, inducing a signal having the same phase as the current flowing in the second inductor to the first inductor and outputting the induced signal to the switching stage.

According to an additional embodiment, the frequency mixing method may further comprise, if the bleeding current flows in the first inductor, inducing a signal having an opposite phase to the current flowing in the first inductor to the second inductor and outputting the induced signal to the switching stage.

According to some embodiment of the present disclosure may improve noise and conversion gain performance compared to the conventional frequency mixers without increasing the size and power consumption by using a transformer.

According to certain embodiment of the present disclosure, the frequency mixer according to the present disclosure may improve the signal-to-noise ratio performance of the mixer by reducing the influence of parasitic capacitance and a current bleeding circuit for reducing flicker noise by using magnetically coupled inductors.

According to certain embodiment of the present disclosure, the direct conversion receiver using the frequency mixer according to the present disclosure may be applied to a wireless communication system to improve gain and noise performance.

BRIEF DESCRIPTION OF THE DRAWINGS

FIG. 1A is a schematic diagram showing a configuration of a direct conversion receiver using a frequency mixer according to an exemplary embodiment of the present disclosure.

FIG. 1B is a graph schematically showing the noise characteristics of the direct conversion receiver according to frequency.

FIG. 2A and FIG. 2B are a schematic diagram and a circuit diagram showing main components of a conventional frequency mixer.

FIG. 3A, FIG. 3B, and FIG. 3C are schematic diagrams and a circuit diagram showing main components of a conventional frequency mixer including a current bleeding circuit.

FIG. 4A, FIG. 4B, and FIG. 4C are schematic diagrams showing main components of a frequency mixer according to an embodiment of the present disclosure.

FIG. 5 is a circuit diagram specifically showing a frequency mixer according to a modification of an embodiment of the present disclosure.

FIG. 6 is a circuit diagram illustrating a gain improvement operation of the frequency mixer according to an embodiment of the present disclosure.

FIG. 7 is a circuit diagram illustrating a noise improvement operation of the frequency mixer according to an embodiment of the present disclosure.

FIG. 8A and FIG. 8B are graphs showing gain and noise figure according to a magnetic coupling coefficient of inductors in the frequency mixer according to an embodiment of the present disclosure.

FIG. 9A and FIG. 9B are graphs showing gain and noise figure according to frequency in the frequency mixer according to an embodiment of the present disclosure.

FIG. 10 is a picture showing an example of implementing the frequency mixer according to an embodiment of the present disclosure using a semiconductor device.

FIG. 11 is a flowchart schematically showing a frequency mixing method according to another embodiment of the present disclosure.

FIG. 12 is a flowchart showing a method of magnetically coupling inductors in a frequency mixing method according to another embodiment of the present disclosure.

FIG. 13 is a flowchart showing a gain improvement operation of the frequency mixing method according to another embodiment of the present disclosure.

FIG. 14 is a flowchart showing a noise improvement operation of the frequency mixing method according to another embodiment of the present disclosure.

DETAILED DESCRIPTION

The above-described and additional embodiments are concretized through embodiments described with reference to the attached drawings. It is understood that the components of each embodiment can be combined in various ways within one embodiment or with components of other embodiments unless there is any other mention or mutual contradiction. Based on the principle that the inventor can appropriately define the concept of terms in order to explain the present disclosure in the best way, the terms used in this specification and claims should be interpreted as meanings and concepts that are consistent with the description or proposed technical idea. A module or a part in this specification may be a set of program instructions stored in a memory such that it can be executed by a computer or processor, or may be implemented using a set of electronic components or circuits such as ASICs and FPGAs to perform such instructions. In addition, the operation of each module or part may be performed by one or more processors or devices. Components indicated by the same or similar symbols perform the same or similar functions, and thus, their descriptions may be omitted. For components having drawing symbols whose descriptions are omitted, reference may be made to the contents described above for components having the same or similar symbols.

Hereinafter, some exemplary embodiments of the present disclosure will be described in detail with reference to the accompanying drawings.

FIG. 1A is a schematic diagram showing a configuration of a direct conversion receiver using a frequency mixer according to an embodiment of the present disclosure, and FIG. 1B is a graph schematically showing the noise characteristics of the direct conversion receiver according to frequency. Referring to FIG. 1A, a communication device according to an embodiment of the disclosure comprises a low noise amplifier 110, a local oscillator 130, a frequency mixer 150, and a low pass filter 170. Additionally, the communication device may further comprise a baseband amplifier 190.

The low noise amplifier (LNA) 110 amplifies and outputs an RF signal received by an antenna. The output RF signal 110*s* is input to the frequency mixer 150.

The local oscillator (LO) 130 outputs a local oscillation (LO) signal 130*s* for converting the frequency of the RF signal 110*s*.

The frequency mixer 150 receives the output signal of the low noise amplifier and the oscillation signal of the local oscillator and outputs a signal having a frequency converted from the RF signal. The frequency mixer 150 may output an IF signal 150*s* having an intermediate frequency obtained by subtracting the frequency of the LO signal 130*s* from the frequency of the RF signal 110*s*. If the frequency of the LO signal is set to be the same as the frequency of the RF signal, the frequency mixer 150 can output a baseband signal. The frequency mixer 150 according to the present disclosure will be described using FIGS. 4A to 5.

The low pass filter (LPF) 170 receives the output signal 150*s* of the frequency mixer 150 and outputs a signal having a frequency lower than a predetermined threshold frequency, an intermediate frequency signal, or a baseband signal.

The baseband amplifier 190 amplifies the baseband signal that has passed through the low pass filter and outputs the amplified baseband signal.

In FIG. 1B, the horizontal axis represents frequency expressed in a log scale, and the vertical axis represents a noise voltage expressed in a log scale. Referring to FIG. 1B, flicker noise is exhibited where noise decreases by 1/f from DC to the corner frequency fc, and when the frequency is greater than the corner frequency fc, constant thermal noise is exhibited.

There are two main causes of flicker noise appearing in the output: a direct cause that appears in the output in proportion to the DC current flowing through a MOSFET element of a switch of the frequency mixer, and an indirect cause that appears more in the output stage due to the parasitic capacitance $C_P$ generated by the switch or a transconductance (gm) element.

The most effective way to reduce flicker noise is to reduce the bias current of the entire circuit, for example, there is a current bleeding structure. The current bleeding structure will be described using FIG. 3.

FIG. 2A and FIG. 2B are a schematic diagram and a circuit diagram showing main components of a conventional frequency mixer. FIG. 2A is a diagram schematically showing the main components of the frequency mixer, and FIG. 2B is a circuit diagram showing the frequency mixer configured using specific elements.

Referring to FIG. 2A, the frequency mixer 150 comprises a transconductance stage 151, a switching stage 152, and a load stage 157. The transconductance stage 151 amplifies an input RF signal and transmits the amplified RF signal to the switching stage 152. The switching stage 152 outputs a signal (an intermediate frequency signal or a baseband signal) having a mixed frequency using the amplified RF signal and a local oscillation (LO) signal. The load stage 157 transmits DC power from a DC voltage ($V_{DD}$) terminal to the switching stage 152 through loads.

FIG. 2B illustrates specific elements constituting the transconductance stage 151, the switching stage 152, and the load stage 157 of the frequency mixer 150. The transconductance stage 151 receives RF signals RF+ and RF− and outputs current corresponding to the input signals. The switching stage 152 converts the frequency of the signal output from the transconductance stage using local oscillation signals LO+ and LO− and outputs converted frequency signals IF+ and IF−. The load stage 157 is electrically connected between the switching stage and a power terminal.

The frequency mixer 150 shown in FIG. 2B has a double balanced Gilbert cell structure. Although all of the illustrated switching and amplifying elements are indicated as NMOSs, some or all of the elements may be configured using a PMOS.

The transconductance stage 151 may be configured as a differential pair to amplify the difference between two input signals RF+ and RF−. For each input, a current amplified by the transconductance gm by MOSFET elements $M_1$ and $M_2$ is output to the switching stage 152. The input signals are transmitted to the gates of the transconductance elements $M_1$ and $M_2$, and the source electrodes of the transconductance elements $M_1$ and $M_2$ are connected to ground and the drain electrodes are connected to input nodes of the switching stage 152.

The switching stage 152 uses two local oscillation signals LO+ and LO− to down-convert the frequency of the amplified signal transmitted from the transconductance stage 151 to generate an intermediate frequency or a baseband signal and outputs the same through output terminals IF+ and IF−. Four transistors $M_3$, $M_4$, $M_5$, and $M_6$ constituting the switching stage 152 are paired in pairs, and the local oscillation signals LO+ and LO− are input to each gate terminal. The signal obtained by amplifying the RF+ signal is input to the first transistor pair $M_3$ and $M_4$, and the signal obtained by amplifying the RF-signal is input to the second transistor pair $M_5$ and $M_6$. The drain of $M_3$ of the first transistor pair is connected to the output terminal IF+ and the drain of $M_5$ of the second transistor pair, and the drain of $M_6$ of the second transistor pair is connected to the output terminal IF− and the drain of $M_4$ of the first transistor pair.

The load stage 157 may be composed of load resistors $R_L$ connecting the DC power terminal $V_{DD}$ and the output terminals IF+ and IF−. In the figure, two load resistors $R_L$ are connected in parallel to the power terminal $V_{DD}$.

FIG. 3A, FIG. 3B, and FIG. 3C are schematic diagrams and a circuit diagram showing main components of a conventional frequency mixer including a current bleeding circuit. FIG. 3A and FIG. 3B are diagrams schematically showing the main components of a frequency mixer 150 including a current bleeding circuit, and FIG. 3C is a circuit diagram showing the frequency mixer 150 including the current bleeding circuit configured using specific components.

Referring to FIG. 3A, the frequency mixer 150 may further comprise the current bleeding stage 155 to reduce flicker noise. The current bleeding stage 155 is connected in parallel to the switching stage 152 and the transconductance stage 151. The added current bleeding stage 155 can reduce the magnitude of flicker noise by leaking some of the current of the frequency mixer 150.

Referring to FIG. 3C, the current bleeding stage 155 may comprise three PMOS elements $M_{P1}$, $M_{P2}$, and $M_{P3}$ and capacitors. The PMOS element $M_{P3}$ connected to the DC power terminal $V_{DD}$ serves as a current source and supplies current to the bleeding circuit. The remaining two PMOS elements $M_{P1}$ and $M_{P2}$ are connected in parallel to the drain electrode of the PMOS element $M_{P3}$ whose source electrode is connected to the DC power terminal $V_{DD}$. The drain electrodes of a pair of PMOS elements $M_{P1}$ and $M_{P2}$ are connected to the gate electrodes of the other elements. The drain electrodes of the pair of PMOS elements $M_{P1}$ and $M_{P2}$ are connected in parallel to the input node of the switching stage 152. That is, the output of the current bleeding stage 155 is connected to the node of the switching stage 152 to which the amplified RF signal is input.

The dynamic current bleeding stage 155 illustrated in FIG. 3C bleeds current on in a switching period of the frequency mixer in which flicker noise mainly occurs. Therefore, by maintaining the input resistance of a switching device in the on state low, RF signal leakage is reduced, thereby improving the conversion gain and noise performance of the entire mixer. That is, by reducing the DC bias current of the switching devices $M_3$ to $M_6$ of the switching stage 152 while maintaining the gain of the transconductance stage 151, flicker noise can be improved. However, there is still a problem that the influence of the parasitic capacitance $C_P$ due to the added dynamic current bleeding circuit is present.

Meanwhile, a structure in which an inductor is added can be used to remove the influence of the parasitic capacitance $C_P$ due to a static/dynamic current bleeding circuit. For example, in FIG. 3C, the drain electrode of the element $M_{P1}$ and the drain electrode of the element $M_{P2}$ can be connected using an inductor. In this case, by resonating the parasitic capacitance $C_P$ and the inductor at the operating frequency, the influence of the parasitic capacitance $C_P$ can be reduced.

However, although the influence of flicker noise and the parasitic capacitor can be improved by the current bleeding stage 155, the conversion gain is still reduced and the thermal noise increases compared to the Gilbert cell active mixer to which the current bleeding stage 155 is not applied due to additional noise caused by PMOS elements added to the current bleeding stage 155 and a leaked signal.

The reduction in the conversion gain due to the current bleeding stage 155 is described using the signal flow indicated by the dotted line in FIG. 3A.

The RF signal input to the transconductance stage 151 is amplified and transmitted to the switching stage 152 (path A1). The amplified RF signal may leak to the current bleeding stage 155 (path A2). Therefore, the conversion gain is reduced by the amount of the leaked RF signal.

The increase in thermal noise due to the current bleeding stage 155 is described using the signal flow indicated by the dotted line in FIG. 3B.

The thermal noise generated in the current bleeding stage 155 affects the output of the switching stage 152 (path B1). The thermal noise increases depending on the circuit and element size of the current bleeding stage 155.

Therefore, it is necessary to improve the performance through additional compensation.

FIG. 4A, FIG. 4B, and FIG. 4C are schematic diagrams showing main components of a frequency mixer according to an embodiment of the present disclosure. FIG. 4A is a schematic diagram showing the main components of the frequency mixer 150 according to an embodiment, and FIG. 4B and FIG. 4C are diagrams illustrating the operation of the frequency mixer 150 according to an embodiment.

According to another embodiment of the proposed disclosure, the active frequency mixer 150 having magnetically coupled inductors comprises a transconductance stage 151, a switching stage 152, a load stage 157, a current bleeding stage 155, first inductors $L_{S1}$ and $L_{S2}$, and second inductors $L_{P1}$ and $L_{P2}$. According to an additional embodiment, the first inductor $L_{S1}$ and the second inductor $L_{P1}$ may be configured as a transformer.

The transconductance stage 151 receives RF signals RF+ and RF−, amplifies the current corresponding to the input signals, and outputs the same to the switching stage 152. The switching stage 152 converts the frequencies of the input signals using a local oscillation signal, and outputs the converted frequency signals through the output terminal OUT. For parts identical/similar to those of the prior art, such as the current bleeding stage 155 and the load stage 157, refer to FIGS. 2A to 3C and the related descriptions.

The first inductors $L_{S1}$ and $L_{S2}$ are magnetically coupled to the second inductors $L_{P1}$ and $L_{P2}$. The curved arrows indicating the inductors in FIG. 4A represent that the inductors are magnetically coupled to each other. The two first inductors $L_{S1}$ and $L_{S2}$ are configured such that no magnetic coupling occurs. The two second inductors $L_{P1}$ and $L_{P2}$ are also configured such that no magnetic coupling occurs. The magnetically coupled first inductors $L_{S1}$ and $L_{S2}$ and second inductors $L_{P1}$ and $L_{P2}$ may be configured as transformers. That is, the first inductor $L_{S1}$ and the second inductor $L_{P1}$ may be configured as a first transformer 153, and the first inductor $L_{S2}$ and the second inductor $L_{P2}$ may be configured as a second transformer 154.

The first inductors $L_{S1}$ and $L_{S2}$ are connected in parallel between the output terminal of the current bleeding stage and the ground. The second inductors $L_{P1}$ and $L_{P2}$ are connected in series between the transconductance stage 151 and the switching stage 152.

The reduction in the conversion gain due to the current bleeding stage 155 by the magnetically coupled inductors is described using the signal flow indicated by the dotted line in FIG. 4B.

When an RF signal is input to the switching stage 152, current flows to the second inductor $L_{P1}$ (path C1). Since the first inductor $L_{S1}$ is magnetically coupled to the second inductor $L_{P1}$, an induced current is generated in the first inductor $L_{S1}$ (path C2). The first inductor $L_{S1}$ and the second inductor $L_{P1}$ are magnetically coupled such that the current C2 entering the point of the first inductor $L_{S1}$ has the same phase (in-phase) as the current C1 coming from the point of the second inductor $L_{P1}$. As a result, the current transmitted to the output terminal increases, which can increase the conversion gain of the frequency mixer.

The increase in thermal noise due to the current bleeding stage 155 by the magnetically coupled inductors is described using the signal flow indicated by the dotted line in FIG. 4C.

When thermal noise occurs in the current bleeding stage 155, some thereof is transmitted to the switching stage 152, and the noise is transmitted to the output terminal together with the output signal (path D1). Meanwhile, some of the thermal noise generated in the current bleeding stage 155 is transmitted to the first inductor $L_{S1}$ (path D2). Since the current D2 coming from the point of the first inductor $L_{S1}$ has the opposite phase (antiphase) to the current D3 coming from the point of the coupled second inductor $L_{P1}$, an antiphase induced current is generated in the magnetically coupled second inductor $L_{P1}$ toward the switching stage 152 due to the thermal noise current transmitted to the first inductor $L_{S1}$ (path D3). Since the induced current D3 generated in the second inductor $L_{P1}$ is in the opposite phase to the thermal noise D1 and D2 generated in the current bleeding stage 155, the thermal noise D1 generated in the current bleeding stage 155 can be reduced to improve the noise characteristics.

FIG. 5 is a circuit diagram specifically showing a frequency mixer according to a modification of an embodiment of the present disclosure.

According to a modification of the present disclosure, an active frequency mixer 150 having magnetically coupled inductors comprises a transconductance stage 151, a switching stage 152, a load stage 157, a current bleeding stage 155, a first inductor stage T1, and a second inductor stage T2.

The transconductance stage 151 receives RF signals RF+ and RF− and outputs current corresponding to the input signals to output terminals $X_1$ and $X_2$ of the transconductance stage 151. The transconductance stage 151 may be composed of a differential pair of transconductance elements $M_1$ and $M_2$ to amplify the difference between the two input signals RF+ and RF−.

The switching stage 152 receives signals output from the transconductance stage 151 through input nodes $Y_1$ and $Y_2$ of the switching stage 152. The switching stage 152 converts the frequencies of the signals amplified and output from the transconductance stage 151 using local oscillation signals LO+ and LO− and outputs the converted frequency signals through output terminals IF+ and IF−. The switching stage 152 may be configured in a Gilbert cell form in which four transistors $M_4$ to $M_6$ are dually balanced.

The load stage 157 is electrically connected between the output terminals IF+ and IF− of the switching stage 152 and the DC power terminal $V_{DD}$. The load stage 157 may comprise a plurality of load resistors $R_L$ connected in parallel with the DC power terminal $V_{DD}$.

The current bleeding stage 155 is connected in parallel with the load stage and outputs a bleeding current to the input nodes $Y_1$ and $Y_2$ of the switching stage 152.

Regarding the frequency mixer 150, the content already described above is omitted, and it can be understood by referring to FIGS. 2 to 4 and the related description if necessary.

The first inductor stage T1 comprises one or more first inductors $L_{S1}$ and $L_{S2}$. The first inductors $L_{S1}$ and $L_{S2}$ are electrically connected between the output terminals of the current bleeding stage 155, i.e., the input nodes $Y_1$ and $Y_2$ of the switching stage 152, and the ground. The first inductors $L_{S1}$ and $L_{S2}$ may serve as resonant inductors to cancel out the parasitic capacitor of the frequency mixer.

The second inductor stage T2 comprises one or more second inductors $L_{P1}$ and $L_{P2}$. The second inductors $L_{P1}$ and $L_{P2}$ are electrically connected between the output terminals $X_1$ and $X_2$ of the transconductance stage 151 and the input terminals $Y_1$ and $Y_2$ of the switching stage 152. The second inductors $L_{P1}$ and $L_{P2}$ may increase the impedance toward the transconductance stage 151 from the switching stage 152, thereby increasing the conversion gain.

The first inductors $L_{S1}$ and $L_{S2}$ and the second inductors $L_{P1}$ and $L_{P2}$ may be configured to be magnetically coupled to each other. The coupled first inductors $L_{S1}$ and $L_{S2}$ and second inductors $L_{P1}$ and $L_{P2}$ may be configured as transformers. For example, the first inductor $L_{S1}$ and the second inductor $L_{P1}$ may be configured as a first transformer 153, and the first inductor $L_{S2}$ and the second inductor $L_{P2}$ may be configured as a second transformer 154.

The frequency mixer 150 illustrated in FIG. 5 can control the current bleeding stage 155 to reduce the total current only at the moment when noise occurs, thereby attenuating the direct occurrence of flicker noise. In addition, even if the circuit size is increased by adding magnetically coupled inductors or transformers, the parasitic capacitance can be reduced, thereby attenuating the indirect occurrence of flicker noise.

FIG. 6 is a circuit diagram illustrating a gain improvement operation of the frequency mixer according to an embodiment of the present disclosure.

According to an additional embodiment, the first inductor $L_{S1}$ induces a signal (path C2) having the same phase as the current (path C1) input from the second inductor $L_{P1}$ to the input node Y of the switching stage 152 and outputs the induced signal through the input node Y of the switching stage 152.

FIG. 6 shows an equivalent circuit that simplifies the frequency mixer into a single-ended circuit, and shows a path along which an RF signal is induced to the switching stage when magnetically coupled inductors or transformers are applied. An RF voltage signal is first amplified and converted into an RF current in the transconductance stage 151 and flows to the switching element $M_3$ through the second inductor $L_{P1}$ and the input node Y of the switching stage 152 (path C1). At the same time, due to the operation of the coupled inductors or transformers, the RF current induced to the first inductor $L_{S1}$ through the second inductor $L_{P1}$ also flows into the input node Y of the switching stage 152 and flows to the switching element $M_3$ (path C2).

At this time, if the RF signal current flowing from the transconductance stage 151 is defined as $I_{IN}$ and the RF current flowing from the switching stage 152 to the output terminal is defined as $I_{OUT}$, the current gain $I_{OUT}/I_{IN}$ by the coupled inductors or transformers can be derived by the following mathematical expression 1.

$$\left|\frac{I_{OUT}}{I_{IN}}\right| = \frac{\left(1+\frac{k}{n}\right)\frac{1}{R_L}}{\sqrt{\left(\frac{1}{R_L}\right)^2+\omega^2 C_{P1}^2\left(1+\frac{k}{n}\right)^4}} = \frac{\left(1+\frac{k}{n}\right)}{\sqrt{1+\omega^2 C_{P1}^2 R_L^2\left(1+\frac{k}{n}\right)^4}} \quad \text{[Mathematical expression 1]}$$

Here, coupling coefficients k and n are defined as $k=M/\sqrt{L_{P1}L_{S1}}$ and $n=\sqrt{L_{S1}/L_{P1}}$, and M represents the mutual inductance value of the transformer. Mathematical expression 1 is simplified on the assumption that the inductances $L_{P1}(1-k^2)$ and $L_{S1}$ according to the magnetically coupled inductors or transformers resonate with the parasitic capacitors $C_{P1}$ and $C_{P2}$ at nodes X and Y, respectively. In addition, when assuming that $$\omega^2 C_{P1}^2 R_L^2\left(1+\frac{k}{n}\right)^4 \ll 1$$

at the operating frequency, Mathematical expression 1 can be approximated as Mathematical expression 2 below.

$$\left|\frac{I_{OUT}}{I_{IN}}\right| \cong 1+\frac{k}{n} \quad \text{[Mathematical expression 2]}$$

As can be ascertained from Mathematical expression 2, the current gain always has a value greater than 1, and as the coupling coefficient k of the magnetically coupled inductors or transformers increases or as the value n decreases, the current gain increases. In other words, by reducing the influence of the parasitic capacitors at the nodes X and Y and minimizing the ratio n of $L_{P1}$ and $L_{S1}$, the current gain and the overall frequency mixer conversion gain can be increased.

FIG. 7 is a circuit diagram illustrating a noise improvement operation of the frequency mixer according to an embodiment of the present disclosure.

According to an additional embodiment, the second inductor $L_{P1}$ induces a signal having a phase opposite to that of the bleeding current (path D2) flowing to the first inductor $L_{S1}$ among the currents output from the current bleeding stage 155 and outputs the same to the input node Y of the switching stage 152 (path D3). As a result, the thermal noise (path D1) output from the current bleeding stage 155 can be partially offset to improve the noise characteristics.

FIG. 7 shows an equivalent circuit that simplifies the frequency mixer into a single-ended circuit. The frequency mixer 150 according to an embodiment can improve the thermal noise performance of the entire frequency mixer by reducing the noise influence on dynamic current bleeding by using magnetically coupled inductors or transformers.

FIG. 7 shows the path through which the thermal noise $\overline{I_{n,IN}}$ of the current bleeding stage 155 is induced to the switching element $M_3$ through the transformer (path D1). Assuming the same conditions as in Mathematical expression 2, the noise ratio of the thermal noise of the current bleeding stage 155 transmitted to the switching element can be derived by Mathematical expression 3 below.

$$\frac{\overline{I_{n,OUT}}}{\overline{I_{n,IN}}} = \frac{1}{1+\frac{\left(1+\frac{k}{n}\right)}{L_P\left(1-k^2\right)}Z_L C_{P1} Z_{OT} - \left(1+\frac{k}{n}\right)^2 Z_L s C_{P1}} \quad \text{[Mathematical expression 3]}$$

Here, $Z_L$ is the input impedance facing the switching element $M_3$, and $Z_{OT}$ represents the output impedance of the transconductance stage 151. Assuming $$\omega^2 C_{P1}^2 R_L^2\left(1+\frac{k}{n}\right)^4 \ll 1$$

as in Mathematical expression 2, the magnitude value of Mathematical expression 3 can be approximated as Mathematical expression 4 below.

$$\left|\frac{I_{OUT}}{\overline{I_n}}\right| \approx \frac{1}{1+\frac{\left(1+\frac{k}{n}\right)^2}{L_P\left(1-k^2\right)}Z_L Z_{OT}} \quad \text{[Mathematical expression 4]}$$

As can be ascertained from Mathematical expression 4, the noise of the current bleeding stage 155 transmitted to the switching element $M_3$ is reduced by $(1+k/n)^2$. Similarly to the current gain of Mathematical expression 2, the noise influence of the current bleeding stage 155 can be minimized by maximizing (1+k/n).

In addition, it can be confirmed that the value $|\overline{I_{n,OUT}}/\overline{I_{n,MP1}}|$ converges to 0 when $Z_{OT}\to\infty$. This indicates that the noise of the current bleeding stage 155 is further attenuated by $Z_{OT}$. Therefore, if there are coupled inductors or transformers, the noise characteristic can be improved.

If there are no coupled inductors or transformers as in FIG. 3, (k=0) and $|\overline{I_{n,OUT}}/\overline{I_{n,MP1}}|=1$, the noise of the current bleeding stage 155 is transmitted as it is to the switching element $M_3$, the noise characteristic deteriorates.

FIG. 8A and FIG. 8B are graphs showing the gain and noise figure according to the magnetic coupling coefficient of the inductors in the frequency mixer according to an embodiment of the present disclosure.

FIG. 8A shows the conversion gain of the active frequency mixer according to change in the coupling coefficient k, and FIG. 8B shows simulation results representing change in the noise figure (NF) of the active frequency mixer according to change in the coupling coefficient k. As represented by Mathematical expressions 2 and 4, it can be confirmed that the conversion gain and noise figure performance are improved as the value k increases.

FIG. 9A and FIG. 9B are graphs showing the gain and noise figure according to the frequency in the frequency mixer according to an embodiment of the present disclosure.

The differential active mixer structure for improving the gain and noise by using transformers proposed in the present disclosure was designed using a CMOS 65 nm process and its usability was verified through simulations. In order to improve the gain and noise performance while minimizing the influence of the parasitic capacitor at nodes X and Y, transformers having inductance values of 4.2 nH and 2.8 nH for the first inductor and the second inductor, respectively, were applied.

FIG. 9A shows the conversion gain of the active frequency mixer according to frequency change, and FIG. 9B shows simulation results representing change in the noise figure (NF) of the active frequency mixer according to frequency change. The black line indicates cases without coupled inductors or transformers, and the red line indicates cases with coupled inductors or transformers.

Referring to FIG. 9, in the case where there are coupled inductors or transformers, the gain increases by 3 dB, and the noise figure (NF) decreases by 1.3 dB, and thus it can be confirmed that both the gain and noise characteristics are improved. That is, it can be confirmed that the active mixer using transformers proposed in the present disclosure can minimize the additional noise influence of the parasitic capacitor and bleeding circuit without increasing the size and power consumption compared to the existing structure and effectively improve the conversion gain and noise characteristics while maintaining the advantages of the existing static/dynamic current bleeding circuits.

FIG. 10 is a picture showing an example of implementing the frequency mixer according to an embodiment of the present disclosure using semiconductor elements.

According to an additional embodiment, the first inductor and the second inductor may be configured as a transformer. At this time, the first inductor serves as a primary coil of the transformer, and the second inductor serves as a secondary coil of the transformer. The transformer may be manufactured using a CMOS process along with a switching element such as a MOSFET. According to an embodiment, the transformer may be manufactured by placing the first inductor inside or outside the second inductor. According to a modification of the embodiment, the transformer may be manufactured by stacking the first inductor on or under the second inductor.

Hereinafter, a method of mixing frequencies in the frequency mixer will be disclosed. Parts omitted to avoid redundant description may be understood by referring to the previous description.

FIG. 11 is a flowchart schematically showing a frequency mixing method according to another embodiment of the present disclosure.

According to another embodiment of the present disclosure, the frequency mixing method comprises the steps of receiving an RF signal from a transconductance stage (S1110), amplifying the input signal on the basis of transconductance (S1130), outputting the amplified current to a switching stage, converting the frequency of the signal amplified based on the transconductance using a local oscillation signal in the switching stage (S1150), and outputting the converted frequency signal.

FIG. 12 is a flowchart showing a method of magnetically coupling inductors in a frequency mixing method according to another embodiment of the present disclosure.

The frequency mixing method comprises a step S1210 of electrically connecting a power terminal to a switching stage using a load, a step S1230 of outputting a bleeding current from a current bleeding stage connected in parallel with the load to the switching stage, a step S1250 of electrically connecting one end of a first inductor in parallel to an output terminal of the current bleeding stage, a step S1270 of electrically connecting a second inductor in series between an output terminal of a transconductance stage and an input terminal of the switching stage, and a step S1290 of magnetically coupling the first inductor and the second inductor to each other.

FIG. 13 is a flowchart showing a gain improvement operation of the frequency mixing method according to another embodiment of the present disclosure.

According to an additional embodiment, the frequency mixing method further comprises a step S1330 of inducing a signal having the same phase as a current flowing in the second inductor to the first inductor and outputting the induced signal to the switching stage when a current is input from the second inductor to the switching stage (S1310).

FIG. 14 is a flowchart showing a noise improvement operation of the frequency mixing method according to another embodiment of the present disclosure.

According to an additional embodiment, the frequency mixing method further comprises a step S1430 of inducing a signal having the opposite phase to a current flowing in the first inductor to the second inductor and outputting the induced signal to the switching stage when a bleeding current flows in the first inductor (S1410).

Although the present disclosure has been described above through embodiments with reference to the attached drawings, the present disclosure is not limited thereto and should be interpreted to encompass various modifications that can be obviously derived by those skilled in the art from the present disclosure. The scope of the claims is intended to encompass such modifications.

What is claimed is:

1. An active frequency mixer including magnetically coupled inductors, comprising:

- a transconductance stage configured to receive an input RF signal and output a current corresponding to the input RF signal;
- a switching stage configured to convert a frequency of a signal output from the transconductance stage using a local oscillation signal and output the converted frequency signal;
- a load stage electrically connected between the switching stage and a power terminal;
- a current bleeding stage connected in parallel with the load stage and outputting a bleeding current to the switching stage;
- a first inductor stage including a first inductor having one end electrically connected to an output terminal of the current bleeding stage; and
- a second inductor stage including a second inductor electrically connected between an output terminal of the transconductance stage and an input terminal of the switching stage, wherein the first inductor and the second inductor are magnetically coupled to each other.

2. The frequency mixer of claim 1, wherein the first inductor and the second inductor are configured as a transformer.

3. The frequency mixer of claim 1, wherein the first inductor and the second inductor are configured as a transformer in which coils are disposed inside or outside each other, or stacked on top of each other.

4. The frequency mixer of claim 1, wherein the first inductor is configured to induce a signal having the same phase as a current input to the switching stage from the second inductor and output the induced signal to the switching stage.

5. The frequency mixer of claim 1, wherein the second inductor is configured to induce a signal having an opposite phase to the bleeding current flowing in the first inductor and output the signal to the switching stage.

6. The frequency mixer of claim 1, wherein the switching stage is configured in the form of a Gilbert cell in which four transistors are dually balanced.

7. The frequency mixer of claim 1, wherein the transconductance stage is configured as a differential pair to amplify a difference between two input signals.

8. A communication device comprising:

a low noise amplifier configured to amplify an RF signal received by an antenna and output the amplified RF signal;

a local oscillator configured to output an oscillation signal having a frequency different from a frequency of the RF signal;

a frequency mixer according to claim 1 configured to receive the output signal of the low noise amplifier and the oscillation signal of the local oscillator and output a signal having a frequency converted from the RF signal; and a low pass filter configured to receive an output signal of the frequency mixer and output a signal having a frequency lower than a predetermined threshold frequency.

9. A frequency mixing method, comprising:

receiving an input RF signal by a transconductance stage, amplifying the input RF signal based on a transconductance, and outputting the amplified RF signal to a switching stage;

converting a frequency of the amplified RF signal, being the input RF signal amplified based on the transconductance, using a local oscillation signal, and outputting the converted frequency signal by the switching stage;

electrically connecting a power terminal to the switching stage using a load;

outputting a bleeding current from a current bleeding stage connected in parallel with the load to the switching stage;

electrically connecting one end of a first inductor to an output terminal of the current bleeding stage;

electrically connecting a second inductor between an output terminal of the transconductance stage and an input terminal of the switching stage; and magnetically coupling the first inductor and the second inductor to each other.

10. The frequency mixing method of claim 9, further comprising, if a current is input from the second inductor to the switching stage, inducing a signal having the same phase as the current flowing in the second inductor to the first inductor and outputting the induced signal to the switching stage.

11. The frequency mixing method of claim 9, further comprising, if the bleeding current flows in the first inductor, inducing a signal having an opposite phase to the current flowing in the first inductor to the second inductor and outputting the induced signal to the switching stage.

* * * * *